(12) United States Patent
Kumekawa et al.

(10) Patent No.: US 7,968,942 B2
(45) Date of Patent: Jun. 28, 2011

(54) SEMICONDUCTOR APPARATUS

(75) Inventors: Tatsumi Kumekawa, Tochigi (JP);
Mitsuhiro Hamada, Hyogo (JP); Shuji Mizokuchi, Niigata (JP)

(73) Assignee: Panasonic Corporation, Osaka (JP)

( * ) Notice: Subject to any disclaimer, the term of this patent is extended or adjusted under 35 U.S.C. 154(b) by 262 days.

(21) Appl. No.: 12/260,562

(22) Filed: Oct. 29, 2008

(65) Prior Publication Data
US 2009/0108344 A1    Apr. 30, 2009

(30) Foreign Application Priority Data

Oct. 29, 2007  (JP) ................................ P2007-280680

(51) Int. Cl.
*H01L 29/66* (2006.01)
(52) U.S. Cl. ................ 257/341; 257/E29.027
(58) Field of Classification Search .................. 257/213, 257/288, 327, 329, 330, 331, 332, 334, 335, 257/341, 342, E29.024, E29.026, E29.027
See application file for complete search history.

(56) References Cited

U.S. PATENT DOCUMENTS
2006/0157779 A1* 7/2006 Kachi et al. ................... 257/330

FOREIGN PATENT DOCUMENTS
JP    2007-048769    2/2007
* cited by examiner

*Primary Examiner* — Minh-Loan T Tran
*Assistant Examiner* — Kevin Quinto
(74) *Attorney, Agent, or Firm* — McDermott Will & Emery LLP

(57) ABSTRACT

The present invention provides a semiconductor apparatus having high reliability with respect to a withstand voltage, leakage characteristics, etc. by disposing a structure of preventing stress occurring by metal wiring from directly acting on a trench relating to the semiconductor apparatus having a trench gate. The semiconductor apparatus of the invention includes a semiconductor substrate including a semiconductor layer having a predetermined impurity concentration, a trench gate formed in the semiconductor layer by filling a stripe-shaped trench by a conductor layer on which surface and interface a gate oxide film is formed, an insulating film covering a surface of the semiconductor layer and having a source contact opening, a source region formed in the semiconductor layer, a source electrode formed on the surface of the semiconductor layer so as to electrically connect to the source region through the source contact opening, a gate peripheral wiring connected to the trench gate at a peripheral edge part of the trench gate, a gate electrode separately formed from the source electrode, formed above the surface of the semiconductor layer and connected to the gate peripheral wiring and a drain electrode formed on an surface of the semiconductor substrate opposite to the surface of the semiconductor layer, wherein the trench gate is formed so as to avoid a corner portion of the source contact opening of the source electrode.

10 Claims, 7 Drawing Sheets

SEMICONDUCTOR APPARATUS

BACKGROUND OF THE INVENTION

The present invention relates to a semiconductor apparatus, and particularly to a semiconductor apparatus such as an insulated gate transistor having a trench structure.

In recent years, as a speedup, high functionalization and low power consumption in electronic equipment such as a mobile telephone are required, a speedup and low power consumption are also desired in a semiconductor apparatus installed in the electronic equipment. Generally, a transistor used in a DC-DC converter and a load switch, etc. with small on resistance is required in order to cope with the speedup and low power consumption. As a method to reduce the on resistance of the transistor, miniaturizing an individual device and increasing a density of a transistor placed per unit area is given. Concrete method is a miniaturization of a trench in a vertical MOSFET with a gate electrode formed in the trench. In this method, the trenches in which transistors are formed are placed in a stripe shape and a width of the trench is miniaturized and also a pitch between the adjacent trenches is decreased and thereby a density of the transistors is increased.

As an example, there is a structure in which multiple trenches are arranged inside a semiconductor chip and a MOSFET is arranged inside the trenches. In this structure, a gate pad is formed on a part of the surface of the semiconductor chip and a gate electrode formed by filling the trenches with polycrystalline silicon is connected to this gate pad by gate wiring formed along the peripheral edge of the semiconductor chip.

As a result of conducting various experiments, the present inventors et al. ascertained that with narrowing of a trench width, a fine sub-trench is formed in a termination part of a trench and this portion becomes a cause of deterioration of a withstand voltage.

A trench is normally formed by etching a substrate surface by reactive ion etching using a mask pattern formed on a surface of silicon substrates. As a result of this, with miniaturization of a trench width, etching gas concentrates in a termination part of the pattern inside the trench and the gas has nowhere to go. Therefore, the gas accumulates in a lower part and supply of an etchant becomes excess locally and thereby, a fine trench (hereinafter called a sub-trench) may be locally formed downward from the bottom of the original trench. Also, in the opening upper edge of the trench, an overhang shape is sometimes formed.

When the sub-trench is formed thus, oxygen is resistant to being supplied to the sub-trench at the time of subsequently forming a silicon oxide by thermal oxidation in an inner wall of the trench. Thus, there is a problem that deterioration of a withstanding voltage at the sub-trench is not avoidable.

In addition to above incomplete oxidation, an influence of stress to the trench caused by an insulator film formed on upper layer of the gate electrode which is formed inside of the trench at a connection part with gate wiring along the peripheral edge of the semiconductor chip. This becomes particularly remarkable in a termination part of the trench in trench etching.

Hence, the present applicant has proposed a MOSFET in which a termination part of a trench is widely constructed (JP-A-2007-48769).

Consequently, oxidation-induced stress resulting from a sub-trench in the termination part of the trench is reduced and deterioration of a withstand voltage can be prevented.

However, in recent years, demands on high current increase and a film thickness of metal wiring as an electrode formed on a surface of a chip constructing this semiconductor apparatus is thick relative to a trench size. Accordingly, distortion of stress to which the trench under this metal wiring is subjected becomes a serious problem.

First, an N-type MOSFET having a conventional stripe-shaped trench gate is explained with reference to FIGS. 9 to 12 as one example of a semiconductor apparatus in order to manifest the problem. FIG. 9 is a top diagram of this N-type MOSFET and a sectional diagram of X-X' of FIG. 9 is shown in FIG. 10. A plurality of trench lines are formed on a semiconductor layer and termination parts of the trench lines are directly connected to gate peripheral wiring. An N-type diffusion region constructing a source region is formed in an epitaxial layer of both ends so as to abut on the trench lines. Also, the opening end of a region in which an N-type diffusion layer constructing a source region 13 is electrically connected to metal wiring constructing a source electrode (pad) 8, that is, a source contact opening part 3 is disposed on trench lines (4) as shown in FIG. 9. As shown in FIG. 9, in a region of a corner part α of the opening end of a source electrode, a corner portion of a source contact opening part is formed on terminations of the trench lines (4) because of placement of a pattern. At this time, stress by the thick metal wiring constructing the source electrode 8 concentrates in the vicinity of this corner and causes distortion in a trench structure located in a lower part (FIG. 10 is a main enlarged explanatory diagram corresponding to a section of A-A of FIG. 11 (a main enlarged diagram of FIG. 9)). Also, formation of the corner portion of the source contact opening part 3 on the terminations of the trenches 4 means that the edge of an insulating film 15 is also positioned on this trench and when the trench end is present in a lower part of the edge of the insulating film 15, a channel of this transistor is formed along an outer wall of the trench. As a result of this, when distortion occurs in the trench, distortion also occurs in the channel formed along the outer wall of the trench and problems of an increase in a leakage current and a decrease in a withstand voltage between a drain and a source might arise.

Also, in the leakage current, the problem of the leakage current resulting from the trench distortion was serious in a body region as well as the source region.

The semiconductor apparatus having the conventional stripe-shaped trench gate as described above is shown in main enlarged diagrams in FIGS. 11 and 12. In this conventional apparatus, there is a region in which a corner portion of the source contact opening part (edge line) 3, that is, an edge portion of the source electrode 8 is formed in upper parts of the trench lines (4) or edges of the trench lines because of restriction of a pattern. This region is the cause of a problem that stress by metal wiring etc. constructing a source electrode concentrates and distorts a trench structure and a withstand voltage and leakage characteristics are deteriorated.

This problem becomes particularly serious as a trench becomes finer and a film thickness of the metal wiring constructing the source electrode becomes thicker with respect to a trench width. Now the occurrence of distortion in the vicinity of the trench depending on whether or not to abut on the metal wiring with a thick film thickness becomes a serious problem.

Also, as described above, etching gas used for forming a trench concentrates in a termination of the trench and a fine sub-trench is locally formed downward. In the case of thermal oxidation of an inner wall of the trench, insufficient supply of oxygen makes a film thickness of a silicon oxide film thin. As a result, when a high electric field is applied to this portion, deterioration of a withstand voltage occurs.

Furthermore, an insulating film formed on gate wiring causes stress distortion to a trench in a connection part to the gate wiring of a peripheral edge part of a chip.

BRIEF SUMMARY OF THE INVENTION

The invention has been implemented in view of the actual circumstances described above and relates to a semiconductor apparatus having a trench gate. An object of the invention is to provide a semiconductor apparatus which prevents stress occurring by metal wiring etc. from directly acting on a trench and has high reliability with respect to a withstand voltage and leakage characteristics.

In order to solve the problems described above, the semiconductor apparatus is formed so that the end of a trench is not present at a corner portion of a source contact opening part where stress by an (interlayer) insulating film or metal wiring concentrates. As a result, the stress is not applied to the trench and the trench is not distorted structurally. Also, the trench end in which a sub-trench tends to be generated is constructed so as not to be near to the corner portion of the source contact opening part. That is reason why the portion with insufficient oxide film is not used as a channel region. Therefore, according to this configuration, deterioration of a withstand voltage and leakage characteristics can be prevented. A distance between the source contact opening part and the trench gate is preferably 1 μm or longer. In this condition, deterioration of a withstand voltage can be prevented.

Also, in the case of adjusting a length of a trench line, a termination part of the trench line is disposed from the corner portion of the source contact opening part in an uniform distance (1 μm). By this configuration, a decrease in a channel width per unit area can be minimized so as to prevent an excessive increase in on resistance.

Also, a distance between the trenches can be reduced by forming a source region in a direction orthogonal to the trench line. In addition, a source N-type diffusion layer is formed in a region which is overlap between a region opened as the source contact and outside region of a gate lead part and a coupling trench part for connecting the mutual trenches. By this configuration, a decrease in a channel width per unit area is minimized and an excessive increase in on resistance is prevented.

Further, by directly connecting the adjacent trench lines using a coupling trench thus, an increase in gate resistance Rg and an increase in a switching speed is prevented.

The first aspect of the invention is a semiconductor apparatus including a semiconductor substrate including a semiconductor layer having a predetermined impurity concentration, a trench gate formed in the semiconductor layer by filling a stripe-shaped trench by a conductor layer on which surface and interface a gate oxide film is formed, an insulating film covering a surface of the semiconductor layer and having a source contact opening, a source region formed in the semiconductor layer, a source electrode formed on the surface of the semiconductor layer so as to electrically connect to the source region through the source contact opening, a gate peripheral wiring connected to the trench gate at a peripheral edge part of the trench gate, a gate electrode separately formed from the source electrode, formed above the surface of the semiconductor layer and connected to the gate peripheral wiring, and a drain electrode formed on an surface of the semiconductor substrate opposite to the surface of the semiconductor layer. In addition, the trench gate is formed so as to avoid a corner portion of the source contact opening of the source electrode.

The second aspect of the invention according to the first aspect of the invention is that an edge of the trench gate is formed along a corner shape of the source contact opening at the corner portion of the source contact opening.

The third aspect of the invention according to the second aspect of the invention is that the source opening part is distant from the each trench gate in more than 1 μm at the corner portion of the source contact opening.

The fourth aspect of the invention according to the first aspect of the invention is that a corner portion of the source contact opening part is formed so as to be positioned on a body region or a source region.

The fifth aspect of the invention is a semiconductor apparatus including a semiconductor substrate including a semiconductor layer having a predetermined impurity concentration, trench gates formed in the semiconductor layer by filling a stripe-shaped trenches by a conductor layer on which surface and interface a gate oxide film is formed, an insulating film covering a surface of the semiconductor layer and having a source contact opening, a source electrode formed at the source contact opening, a gate peripheral wiring connected to the trench gate at a peripheral edge part of the trench gate, a gate electrode separately formed from the source electrode, formed above the surface of the semiconductor layer and connected to the gate peripheral wiring and a drain electrode formed on an surface of the semiconductor substrate opposite to the surface of the semiconductor layer. In addition, some of the trench gates are formed so that ends of the some of the trench gates are distant from the corner portion of the source contact opening in an equal distance, and adjoining ends of the some of the trench gates are electrically connected.

The sixth aspect of the invention is a semiconductor apparatus including a semiconductor substrate including a semiconductor layer having a predetermined impurity concentration, trench gates formed in the semiconductor layer by filling a stripe-shaped trenches by a conductor layer on which surface and interface a gate oxide film is formed, an insulating film covering a surface of the semiconductor layer and having a source contact opening, a source region formed in the semiconductor layer, a source electrode formed on a surface of the semiconductor layer so as to electrically connect to the source region through the source contact opening, a gate peripheral wiring connected to the trench gate at a peripheral edge part of the trench gates, a gate electrode separately formed from the source electrode, formed on a region of surface of the semiconductor layer which is corresponding to the source contact opening and connected to the gate peripheral wiring, a drain electrode formed on an surface of the semiconductor substrate surface opposite to the surface of the semiconductor layer and the connection trenches electrically connecting adjoining trench gates at the edge of the trench gates. In addition, the source region contacting to the trench is formed on a region where the connection trench and gate peripheral wiring are not formed so as to have a predetermined depth at both ends of the source region.

The seventh aspect of the invention according to the sixth aspect is that the trench gate is formed so as to avoid a corner portion of the opening of the source electrode.

The eighth aspect of the invention is that an edge of the trench gate is formed along a corner shape of the source contact opening in a corner portion of the source contact opening part.

According to a structure of the invention as described in detail above, as a semiconductor apparatus having a stripe-shaped trench structure is constructed so that the end of a trench is spaced from the edge of an (interlayer) insulating film or metal wiring, deterioration of a withstand voltage and occurrence of a leakage current resulting from distortion is prevented.

Also, increases in on resistance and a switching speed are minimized.

DETAILED DESCRIPTION OF PREFERABLE EMBODIMENT

Embodiments of the invention are described in detail with reference to the drawings hereinafter.

Figure 1:
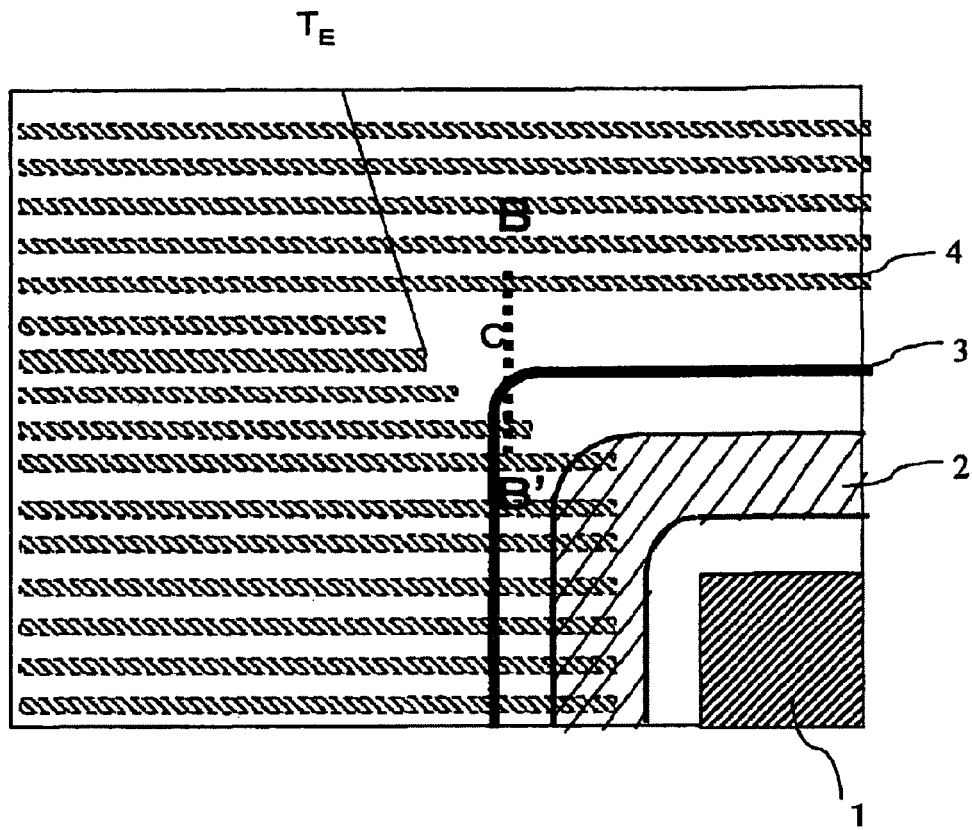
FIG. 1 is a main conceptual diagram of a trench MOSFET according to a first embodiment of the invention.
Figure 2:
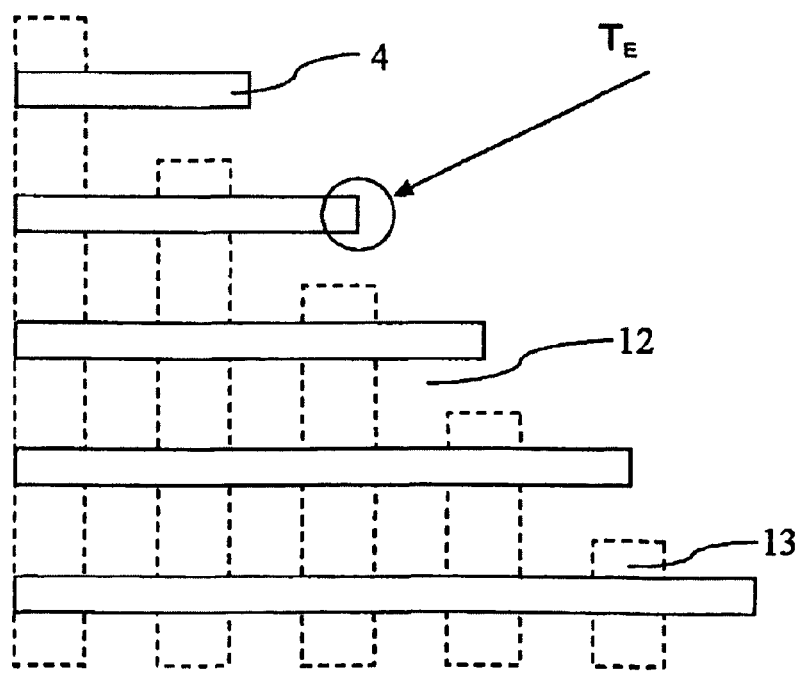
FIG. 2 is an enlarged diagram of termination parts of trench lines of the trench MOSFET of the first embodiment of the invention.
Figure 3:
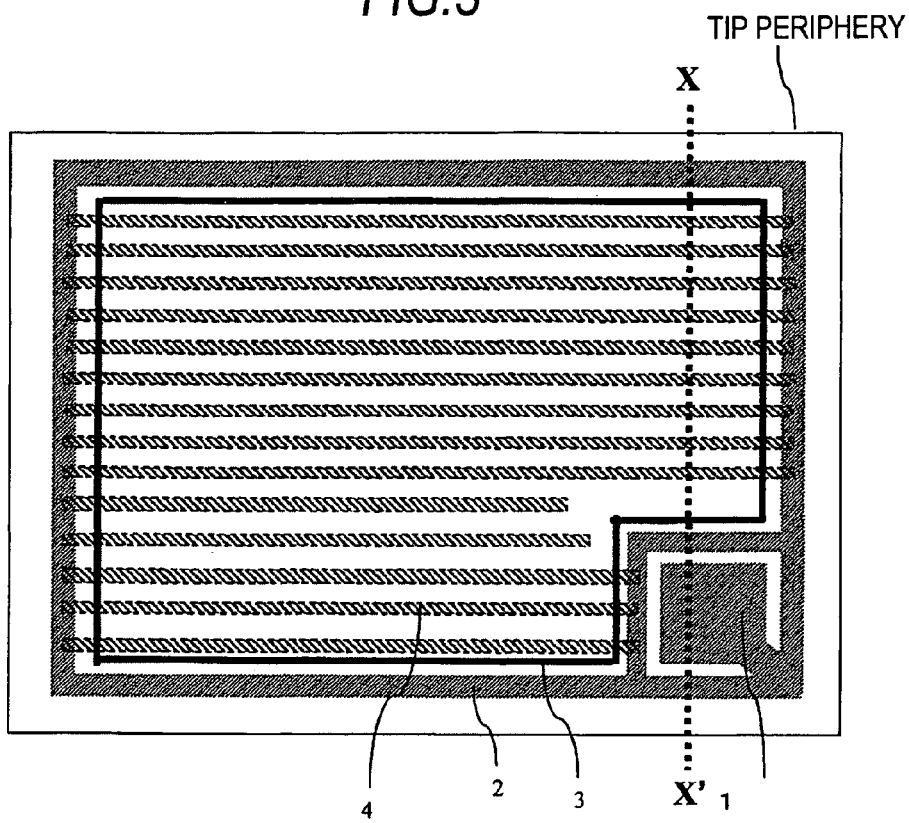
FIG. 3 is the whole outline plan diagram of the trench MOSFET according to the first embodiment of the invention.
Figure 4:
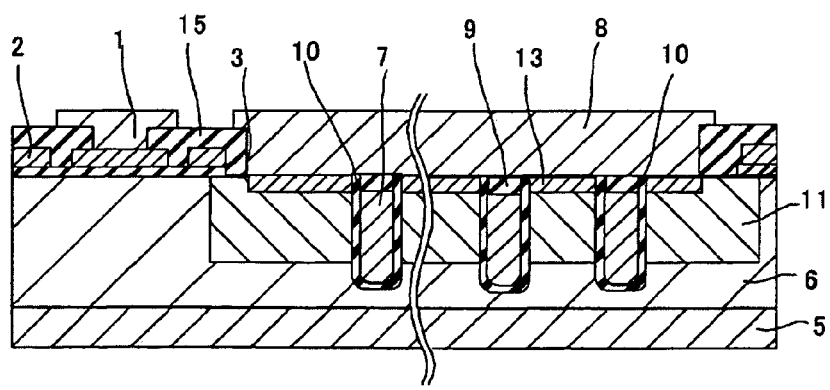
FIG. 4 is a sectional diagram of X-X' of FIG. 3.

FIG. 1 shows a main conceptual diagram according to an embodiment of the invention. FIG. 2 shows an enlarged diagram showing a structure of termination parts of trench lines of the embodiment of the invention. FIG. 3 shows a plan placement diagram of the trench lines on a semiconductor layer of the embodiment of the invention. FIG. 4 shows a sectional diagram of X-X' of FIG. 3, and FIG. 5 shows a sectional diagram of B-B' of FIG. 1.

Figure 5:
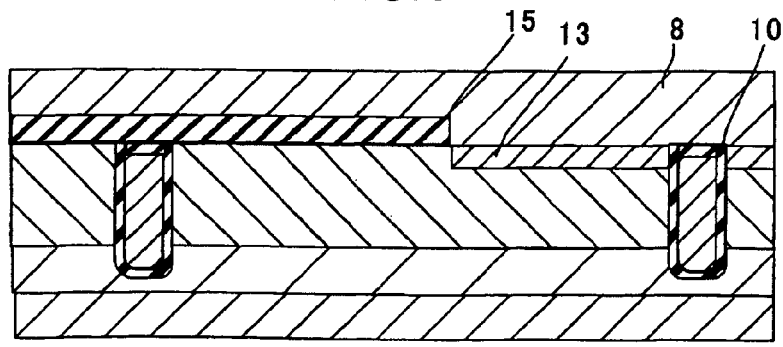
FIG. 5 is a sectional diagram of B-B' of FIG. 1.

As shown in FIGS. 1 and 5, a trench MOSFET of the embodiment is formed so that the edges $T_E$ of trenches avoid a corner C of the source contact opening 3. This configuration means that the corner C which is conventionally formed in a vicinity of trench ends (4) is disposed so as to be more than 1 μm distant from any trench lines (4), that is trench gates 7. This configuration prevents the stress generated by the metal wiring from directly acting on a trench structure and deterioration of withstand voltage or leakage characteristics. In this configuration, the corner C of the source contact 3 is positioned above a body region 12 or a source region 13.

In addition to above advantage, the configuration of the embodiment prevents deterioration of a withstand voltage resulting from a reduction in a film thickness of a silicon oxide film due to a sub-trench. Further, a trench is prevented from being subjected to stress by the edge of an insulating film formed on a gate electrode at a connection part to gate wiring of a peripheral edge part of a chip. The source contact opening part 3 is an opening part for forming a source electrode (pad) 8. In this embodiment, the source region 13 is formed in a direction orthogonal to a direction of formation of the trench 4. The source region 13 is, however, not formed in the vicinity of a termination part of the trench.

Besides, according to this configuration, when the trench gate is linearly elongated, it is possible that some trenches are positioned within 1 μm from the corner portion of the source contact opening part 3. In this case, a termination part of the some trenches are changed so that the end of the some trenches are distant form the corner portion in a predetermined distance (about 1 μm) or more. That is, the termination parts of the trenches 4 are formed so as to be spaced by the predetermined distance (1 μm or longer) along the shape of the corner portion C of the source contact opening part 3. Then, as shown in FIG. 3, a gate electrode is constructed by connecting the trench gate 7 made of a polycrystalline silicon film with which the trench 4 is filled to a gate electrode (pad) 1 made of an aluminum layer through gate peripheral wiring 2 made of a polycrystalline silicon film placed in the peripheral edge of a chip.

Also, in the case of adjusting a length of the trench line (4), a termination part of the trench line is disposed to be distant from the corner portion of the source contact opening part 3 in the predetermined distance (1 μm or longer). In this disposition, the source region 13 made of an N-type diffusion layer is formed orthogonal to an direction of the trench line (4) as shown in FIG. 2. By this configuration, further reduction of a distance between the trenches is achieved. Therefore, a decrease in a channel width per unit area is minimized and an excessive increase in on resistance is prevented. Also, the source region 13 is constructed so as not to be placed in the top of the trench.

Therefore, an increase in gate resistance Rg is prevented and an increase in switching speed is prevented.

A conventional configuration is adopted in the other portions. As shown in FIG. 4, trench 4 is formed in the semiconductor layer. The trench gate 7 is formed by filling polycrystalline silicon through the gate oxide film made of silicon oxide in the trench 4. The source region 13 contacts to the trench gate 7 and is formed so as to have a certain depth at the both ends. Through the source contact opening part 3, the trench gate 7 and the source electrode 8 (source pad) are electrically connected.

A drain region is constructed of an N-type epitaxial layer 6 and an N-type substrate 5, and the whole back of a semiconductor chip is formed in a drain electrode (not shown).

Figure 9:
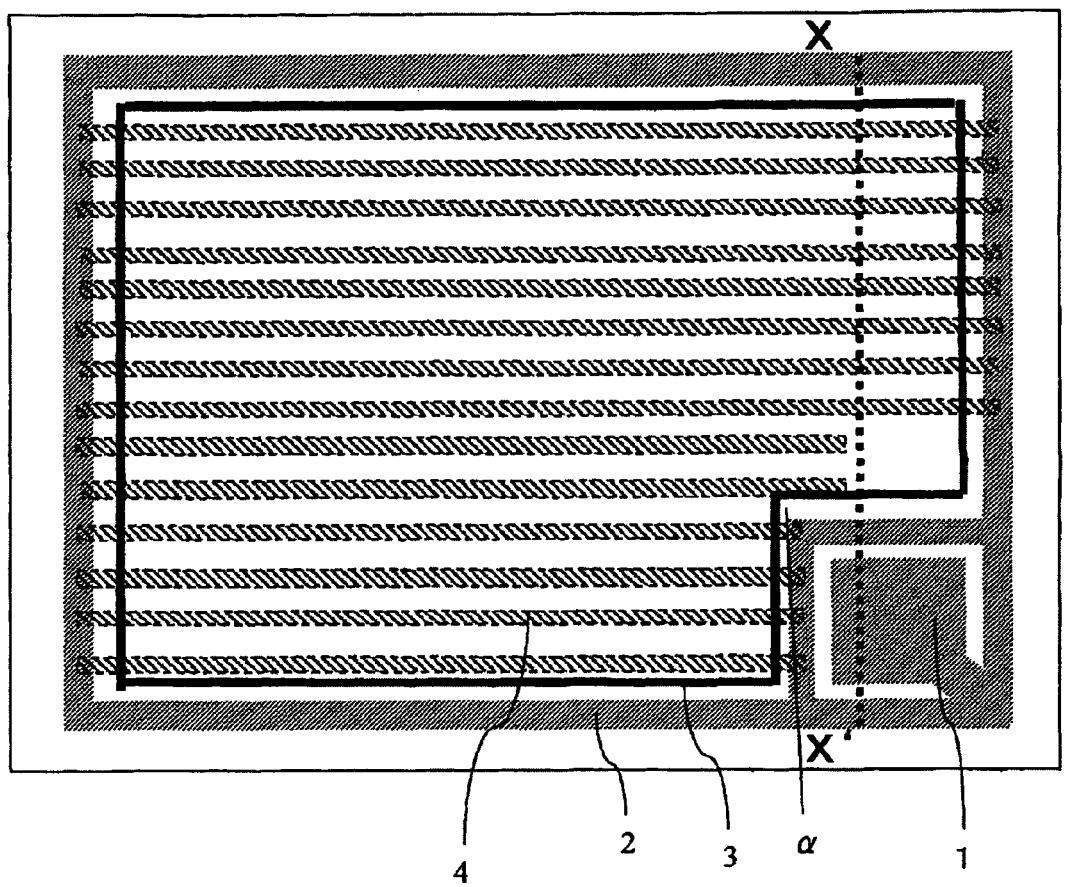
FIG. 9 is the whole outline plan diagram of a trench MOSFET of a conventional example.

That is, the embodiment includes the trench gate 7 which is formed by filling a plurality of stripe shape trench 4 formed in a N-type epitaxial layer 6 formed on a surface of a N-type silicon substrate with the polycrystalline silicon layer (conductor layer) through a gate oxide film, an insulator film made of silicon oxide covering the surface of the semiconductor layer, a source electrode 8 formed on the insulator film so as to contact to the source region 13 through a source contact opening part 3, a gate peripheral wiring 2 connected to the trench gate 7 at the periphery of the trench gate 7, a gate electrode 1 formed on the same plane with the source electrode, separated from the gate electrode 8, and connected to the gate peripheral wiring 2, and the drain electrode (not shown) formed on the back of the semiconductor chip (see FIG. 4). In addition, the sectional diagram of X-X' shown in FIG. 4 is similar to the sectional diagram of X-X' of FIG. 9 showing the trench MOSFET described in the background art.

In addition, as shown in FIG. 3, the gate peripheral wiring 2 is arranged not only at a peripheral edge part of a chip but also between the source electrode 8 and the gate electrode 1 so as to surround the formation region of the gate electrode 1.

Therefore wiring resistance is reduced by further shortening a power feeding line for power feeding to the trench gate.

In the embodiment of the invention, as shown in FIG. 1, the corner portion of the source contact opening part which is conventionally formed in the vicinity of the trench lines is formed so as to be 1 μm or longer distant from the ends of all the trench lines. As a result, stress generated by metal wiring constructing the source electrode 8 is prevented from directly acting on a trench structure and deterioration of a withstand voltage or leakage characteristics is prevented. Also, with respect to a trench line having a possibility of being positioned within 1 μm from the corner portion of the source contact opening part 3 formed in the insulating film 15 made of a silicon oxide film with which the surface is covered, termination parts of all the trench lines are formed so as to be spaced by an equal distance (about 1 μm) from the corner portion. And further, the source region 13 made of an N-type diffusion layer having a certain depth in a direction orthogonal to this trench line is formed. Consequently, an increase in on resistance Ron is minimized and stress is prevented from acting on the trench structure.

Next, a manufacturing method of a semiconductor apparatus of the invention is described with reference to FIGS. 6A, 6B, 6C and 6D. The manufacturing method only differs in a mask pattern for trench formation and a mask pattern for source contact formation from a conventional manufacturing step. The manufacturing step is same as that of conventional manner.

Figure 6A:
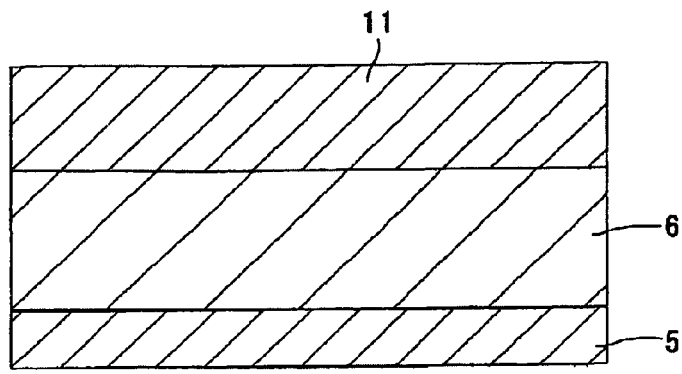
FIGS. 6A, 6B, 6C and 6D are manufacturing step diagrams of the trench MOSFET according to the first embodiment of the invention.

In a manufacturing method of an N-type MOSFET having a stripe-shaped trench gate structure, as shown in FIG. 6A, an N+ type silicon wafer is used as a semiconductor substrate 5 and an N- type epitaxial layer 6 is formed on a surface of the semiconductor substrate. A P-type well layer 11 is formed inside this N- type epitaxial layer.

Figure 6B:
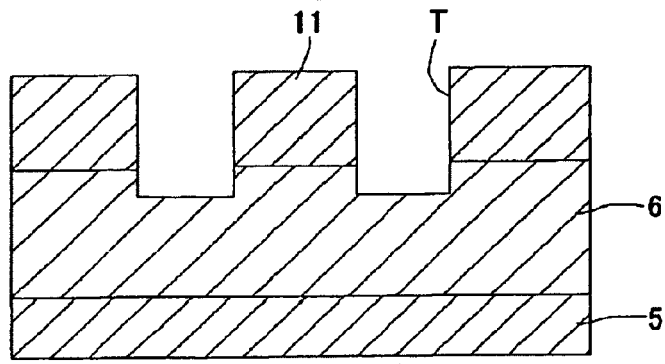

Next, as shown in FIG. 6B, trenches 4 are formed in a surface of the N- type epitaxial layer in which the P-type well layer 11 is formed by photolithography and dry etching.

Figure 6C:
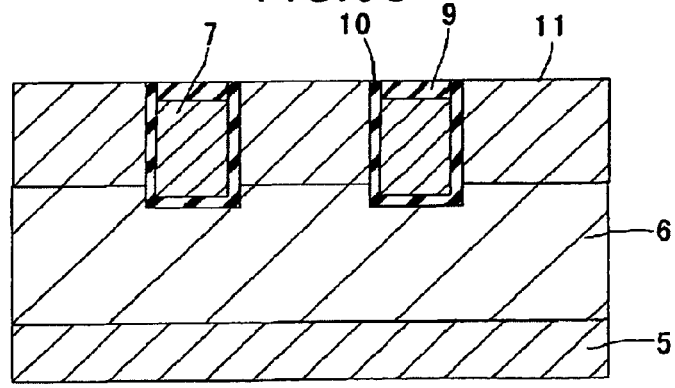

Subsequently, as shown in FIG. 6C, after a gate oxide film 10 with a film thickness of about 30 nm is formed on a side wall of the trench by thermal oxidation, a polycrystalline silicon film (trench gate) 7 is deposited inside the trench 4 by a CVD method and the polycrystalline silicon (7) is doped with impurities. Subsequently, the unnecessary part is removed by etch back or chemical mechanical polishing (CMP) and thereafter, a silicon oxide film 9 is formed on this polycrystalline silicon (7) by thermal oxidation.

Figure 6D:
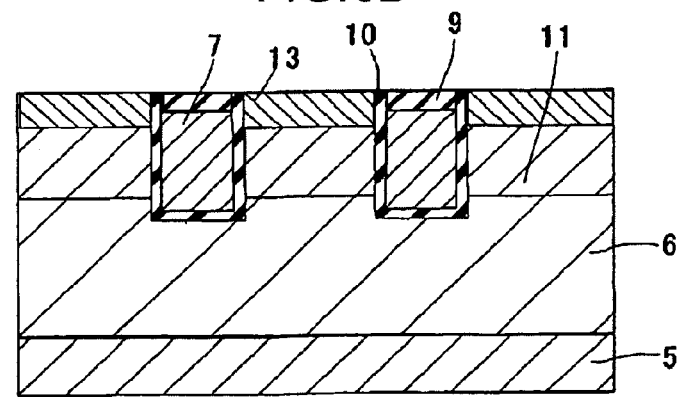

In order to form an N-type diffusion layer used as a source region 13 and a P-type diffusion layer used as a body region 12, phosphorus and boron impurities are implanted into the P-type well layer 11 using an ion implantation method as shown in FIG. 6D.

Thereafter, in order to deposit an insulating film and a protective film on a surface of a semiconductor chip and make electrical contact between a source electrode 8 and the source region 13, a source contact opening part 3 is disposed and an aluminum thin film is formed and metal wiring constructing the source electrode 8 is formed. The semiconductor apparatus as shown in FIGS. 4 and 5 is formed in this manner.

Figure 10:
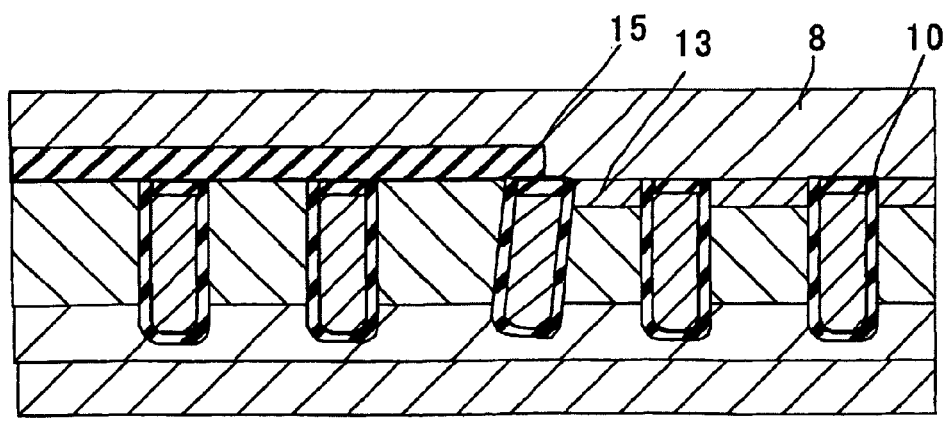
FIG. 10 is a sectional diagram (sectional diagram of A-A of FIG. 1) of a trench gate structure of the conventional example.
Figure 11:
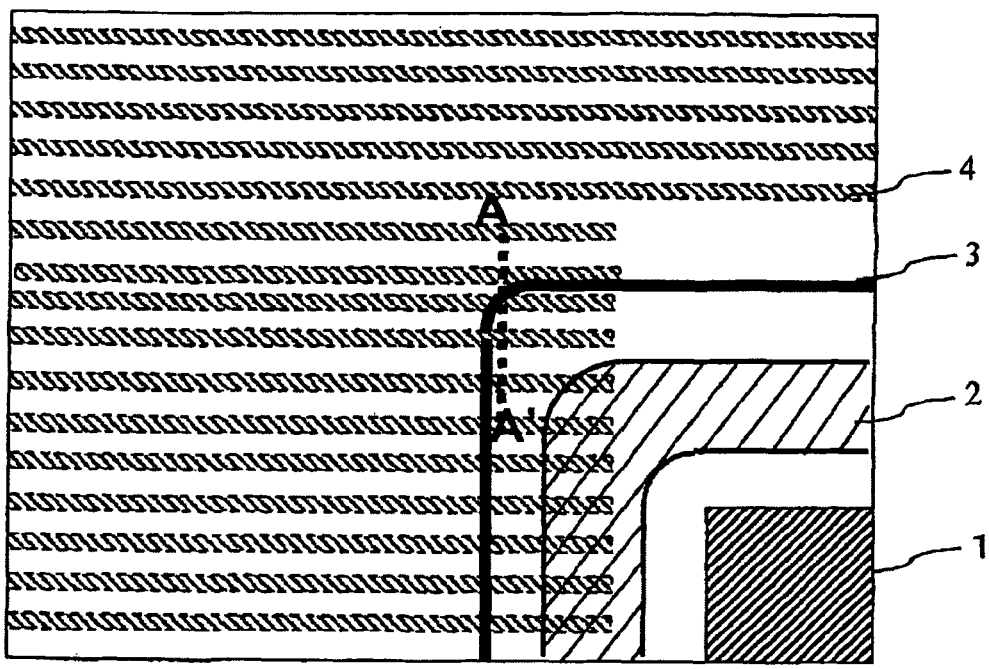
FIG. 11 is a main conceptual diagram of the trench MOSFET of the conventional example.
Figure 12:
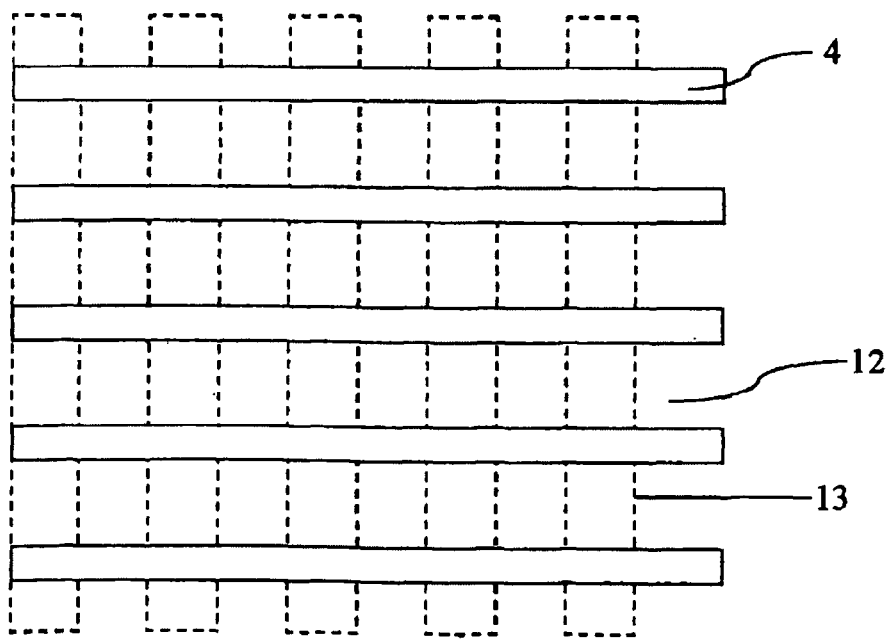
FIG. 12 is an enlarged diagram of termination parts of a trench line structure of the conventional example.

According to this configuration, even when stress by metal wiring concentrates in a corner portion of a source contact opening part, the trench 4 is not present in this corner portion (see FIG. 5). Instead, the source region 13 or the body region 12 is present so that its stress is not applied to the trench and the trench is not distorted structurally. Though FIG. 5 is the portion corresponding to FIG. 10 of a conventional example, the trench is not present in a region in which stress by metal wiring etc. concentrates as is evident from comparison with FIG. 10. Therefore, according to such a configuration, deterioration of a withstand voltage or leakage characteristics can be prevented.

Also, when a source is grounded and a voltage is applied to a drain, leakage of current between the source and the drain (IDSS) is suppressed.

Second Embodiment

Next, a second embodiment of the invention is described.

Figure 7A:
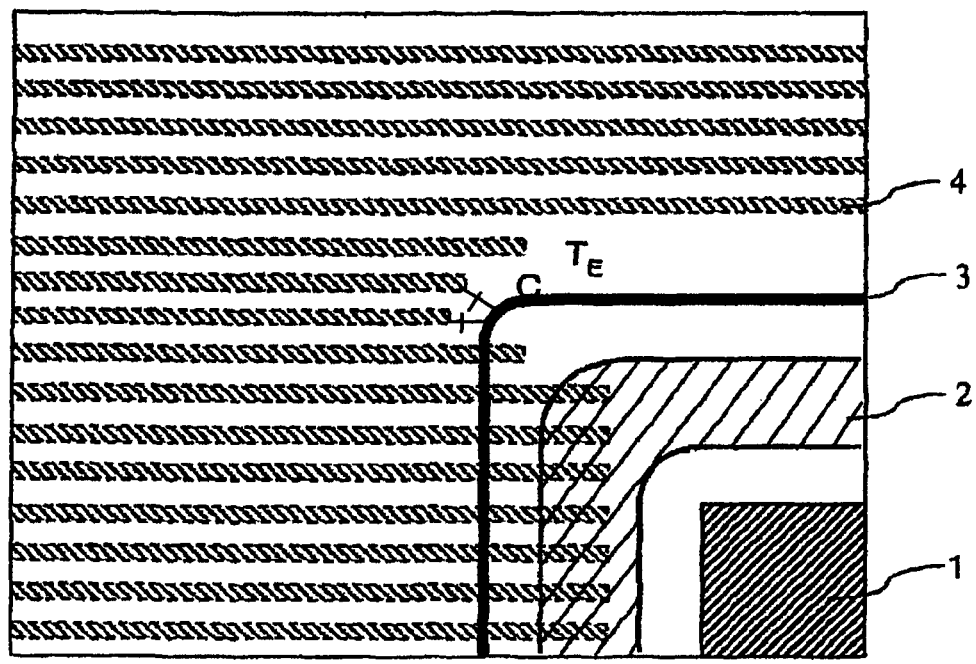
FIGS. 7A and 7B are main conceptual diagrams of a trench MOSFET according to a second embodiment of the invention.
Figure 7B:
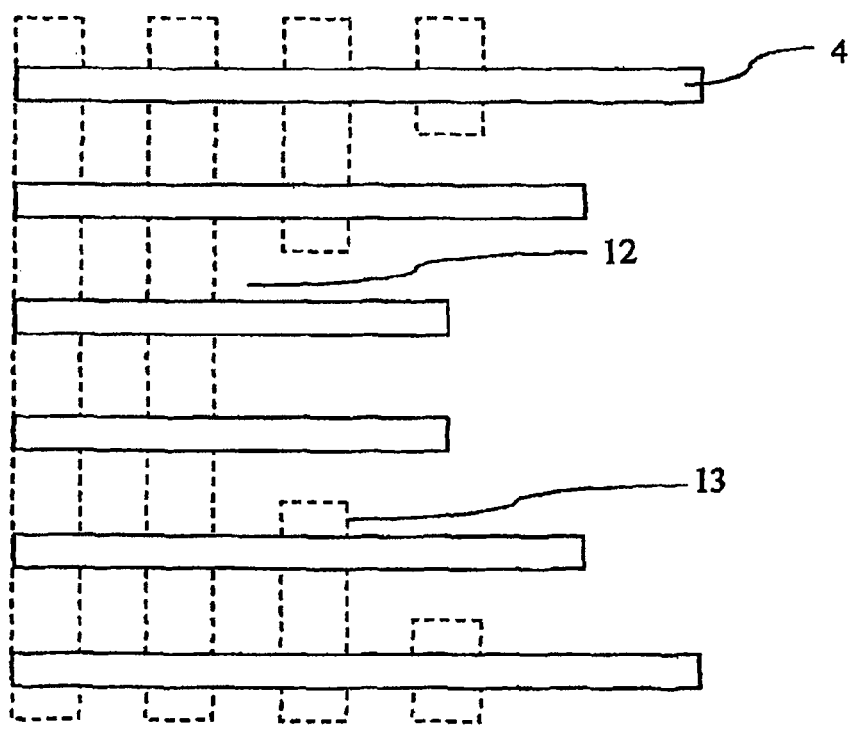

The first embodiment is constructed so that the termination parts of the trenches are distant from the corner portion of the source contact opening part 3 by the predetermined distance (1 μm) or longer as shown in FIG. 2. Instead, the present embodiment is characterized in that termination parts of trenches are distant from a corner portion C by an equal distance (1 μm) as shown in FIGS. 7A and 7B. FIG. 7B is a main enlarged diagram of FIG. 7A. Since a source region 13 made of an N-type diffusion layer is also formed in a direction orthogonal to a trench 4 herein, it is easy to form the source region 13 in a state of avoiding the end of the trench. As a result a decrease in a channel width per unit area is minimized and an excessive increase in on resistance is prevented.

In this second embodiment, with respect to a trench having a possibility of being positioned within 1 μm from the corner portion of the source contact opening part 3, a termination part of the trench is changed and the termination parts of all the trenches 4 are formed so as to be distant from the corner portion by an equal distance (about 1 μm). That is, the termination parts of the trenches 4 are formed so as to be spaced by the equal distance (about 1 μm) along the shape in the corner portion C of the source contact opening part 3. Then, as shown in FIG. 7A, a gate electrode is constructed by connecting a trench gate 7 made of a polycrystalline silicon film with which the trench 4 is filled to a gate electrode (pad) 1 made of an aluminum layer through gate peripheral wiring 2 made of a polycrystalline silicon film placed in the peripheral edge of a chip.

Also, in the case of adjusting a length of the trench line (4), a termination part of the trench line is placed in a position spaced by the equal distance (1 μm) from the corner portion of the source contact opening part 3 and the source region 13 made of the N-type diffusion layer is formed orthogonal to an arrangement direction of the trench line (4). As a result, a distance between the trenches is reduced further. Therefore, a decrease in a channel width per unit area is minimized and an excessive increase in on resistance is prevented. Also, the source region 13 can be constructed so as not to be placed in the top of the trench.

Therefore, an increase in gate resistance Rg is prevented and an increase in switching speed is prevented.

Third Embodiment

Next, a third embodiment of the invention will be described.

Figure 8A:
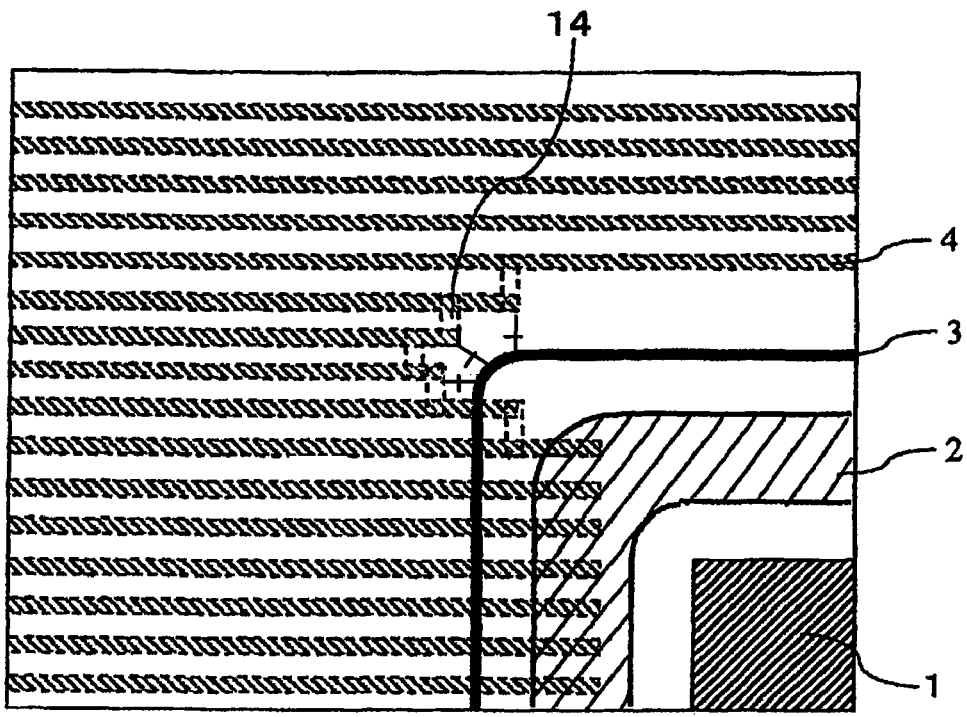
FIGS. 8A and 8B are main conceptual diagrams of a trench MOSFET according to a third embodiment of the invention.
Figure 8B:
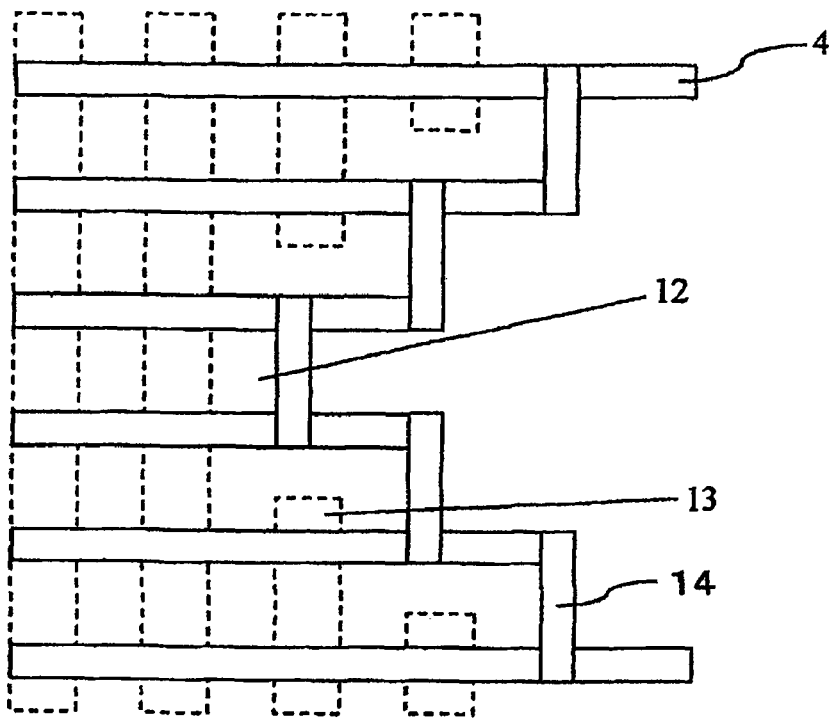

In the second embodiment, termination positions of the trenches are gradually changed so that the termination parts of the trenches are distant from the corner portion of the source contact opening part 3 by the equal distance (1 μm) as shown in FIGS. 7A and 7B. In addition to this feature, in this third embodiment, a coupling trench 14 for coupling adjacent trenches in the vicinity of the trench ends are disposed as shown in FIGS. 8A and 8B. In addition, a source region 13 is not disposed in the vicinity of the coupling trench 14.

According to this configuration, by directly connecting the adjacent trenches by the coupling trench 14, an increase in gate resistance is prevented and a switching speed is reduced.

Also, as the source region is not disposed in the vicinity of the coupling trench, performance of the MOSFET is stabilized. This stabilization is a result of formation of channels so as not to be in the vicinity of the coupling trench 14 because there are possibilities of local fluctuation in MOSFET performance. That is a consequence of sub-trench formation and non-uniform gate oxide film thickness and quality due to insufficient supply of oxygen to the sub-trench in this region. By avoiding these possibility, the stabilize effect is obtained.

Also, in the third embodiments, the trench MOSFET is described, but it is not limited to the MOSFET and it can also be applied to other elements having a trench structure such as a trench capacitor or DRAM. By formed in a state of avoiding overlap of trenches in a corner part of contact or with an upper electrode, leakage resulting from distortion in the end of the electrode of the upper part is suppressed and a leakage current is reduced.

According to the invention as described above, in the case of device miniaturization, generation of internal stress is reduced and switching characteristics are good and a leakage current is suppressed. Therefore application of the present invention to a small electronic device such as a portable terminal is effective.

What is claimed is:

1. A semiconductor apparatus comprising:
a semiconductor substrate including a semiconductor layer having a predetermined impurity concentration;
a plurality of trench gates each formed in the semiconductor layer, and having a stripe-shaped trench filled with a conductor layer and a gate oxide film;
a gate peripheral wiring connected to ends of the plurality of trench gates;
a protective film covering a surface of the semiconductor layer and the gate peripheral wiring, and having a source contact opening;
a source region formed in the semiconductor layer;
a source electrode formed in the source contact opening so as to electrically connect to the source region through the source contact opening;
an insulating film covering the conductor layer; and
a drain electrode formed on a back surface of the semiconductor substrate opposite to the surface of the semiconductor layer,
wherein no corner portion of the source contact opening is disposed on the plurality of trench gates.

2. The semiconductor apparatus according to claim 1, wherein edges of the trench gates around the corner portion of the source contact opening are formed along a corner shape of the corner portion of the source contact opening.

3. The semiconductor apparatus according to claim 2, wherein the edges of the trench gates around the corner portion are distant from the corner portion in more than 1 μm.

4. The semiconductor apparatus according to claim 1, further comprising:
a gate electrode separately formed from the source electrode, formed above the surface of the semiconductor layer and connected to the gate peripheral wiring.

5. A semiconductor apparatus comprising:
a semiconductor substrate including a semiconductor layer having a predetermined impurity concentration;
a plurality of trench gates each formed in the semiconductor layer, and having a stripe-shaped trench filled with a conductor layer and a gate oxide film;
a protective film covering a surface of the semiconductor layer and having a source contact opening;
a source electrode formed at the source contact opening;
a gate peripheral wiring connected to ends of the plurality of trench gates;
a drain electrode formed on a back surface of the semiconductor substrate opposite to the surface of the semiconductor layer,
wherein some of the plurality of trench gates are formed so that ends of the some of the plurality of trench gates are distant from a corner portion of the source contact opening in an equal distance, and adjoining ends of the some of the plurality of trench gates are electrically connected.

6. The semiconductor apparatus according to claim 5, further comprising:
a gate electrode separately formed from the source electrode, formed above the surface of the semiconductor layer and connected to the gate peripheral wiring.

7. A semiconductor apparatus comprising:
a semiconductor substrate including a semiconductor layer having a predetermined impurity concentration;
a plurality of trench gates each formed in the semiconductor layer, and having a stripe-shaped trench filled with a conductor layer and a gate oxide film;
a gate peripheral wiring connected to ends of the plurality of trench gates;
a protective film covering a surface of the semiconductor layer and the gate peripheral wiring, and having a source contact opening;
a source region formed in the semiconductor layer;
a source electrode formed in the source contact opening so as to electrically connect to the source region through the source contact opening;
an insulating film covering the conductor layer;
a drain electrode formed on a back surface of the semiconductor substrate surface opposite to the surface of the semiconductor layer; and
connection trenches electrically connecting adjoining trench gates at ends of the plurality of trench gates,
wherein the source region is formed so as to contact the plurality of trench gates and not to contact the connection trenches, and so as to have a predetermined depth at both ends of the source region.

8. The semiconductor apparatus according to claim 7, further comprising:
a gate electrode separately formed from the source electrode, formed above the surface of the semiconductor layer and connected to the gate peripheral wiring.

9. The semiconductor apparatus according to claim 7, wherein no corner portion of the source contact opening is disposed on the plurality of trench gates.

10. The semiconductor apparatus according to claim 9, wherein edged of the plurality of trench gates around the corner portion of the source contact opening are formed along a corner shape of the corner portion of the source contact opening
wherein edges of the trench gates around the corner portion of the source contact opening are formed along a corner shape of the corner portion of the source contact opening.

* * * * *